United States Patent
Miyazaki et al.

(10) Patent No.: US 7,459,030 B2
(45) Date of Patent: Dec. 2, 2008

(54) MANUFACTURING METHOD OF $Nb_3Sn$ SUPERCONDUCTIVE WIRE USING POWDER TECHNIQUE

(75) Inventors: Takayoshi Miyazaki, Kobe (JP); Hiroyuki Kato, Kobe (JP); Kyoji Zaitsu, Kobe (JP); Kyoji Tachikawa, Hiratsuka (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 81 days.

(21) Appl. No.: 11/596,470

(22) PCT Filed: May 17, 2005

(86) PCT No.: PCT/JP2005/008970

§ 371 (c)(1),
(2), (4) Date: Nov. 13, 2006

(87) PCT Pub. No.: WO2005/117032

PCT Pub. Date: Dec. 8, 2005

(65) Prior Publication Data

US 2007/0175543 A1    Aug. 2, 2007

(30) Foreign Application Priority Data

May 25, 2004    (JP) ............................. 2004-155254

(51) Int. Cl.
*H01L 39/24* (2006.01)
(52) U.S. Cl. ............................. 148/98; 419/23; 29/599
(58) Field of Classification Search .................. None
See application file for complete search history.

(56) References Cited

U.S. PATENT DOCUMENTS

2006/0216191 A1*   9/2006  Miyazaki et al. ............... 419/8

OTHER PUBLICATIONS

Tachikawa, K. "Developments of A15 Filamentary Composite Superconductors", Plenum Press, 1980, pp. 1-15.
Neijmeijefr, W.L., et al. "Characteristics of a Production Route for Filamentary $Nb_3Sn$ Superconductors Based on a Reaction Between Niobium and $Nb_6Sn_5$", Journal of the Less-Common Metals vol. 160, Elsevier Sequoia/ Printed in the Netherlands, 1990, pp. 161-170.
International Search Report of PCT/JP2005/008970 mailed Sep. 6, 2005.

* cited by examiner

*Primary Examiner*—John P. Sheehan
(74) *Attorney, Agent, or Firm*—Reed Smith LLP; Stanley P. Fisher, Esq.; Juan Carlos A. Marquez, Esq.

(57) ABSTRACT

Disclosed is a manufacturing method of an $Nb_3Sn$ superconductive wire using a powder technique, the method including the steps of: filling, as a raw powder, an intermetallic compound powder obtained from a metallic powder containing at least one metallic powder selected from Ta powder and Nb powder, and Sn powder, or a mixture of the metallic powder and the Sn powder into a sheath made of Nb or an Nb based alloy; performing a diameter-reduction process on the sheath to form a wire; heat treating the wire; and, forming a superconductive layer on the interface between the sheath and the powder, wherein at least one of the metallic powders selected from the Ta powder and the Nb powder is obtained by aggregating fine particles (primary) in shape of coral to form secondary particles.

9 Claims, 2 Drawing Sheets

MANUFACTURING METHOD OF NB₃SN SUPERCONDUCTIVE WIRE USING POWDER TECHNIQUE

TECHNICAL FIELD

The present invention relates to a manufacturing method of an $Nb_3Sn$ superconductive wire using a powder technique. More specifically, the present invention relates to a powder technique-based method for manufacturing an $Nb_3Sn$ superconductive wire useful as a material for a superconductive magnet excellent in generation of a high magnetic field.

BACKGROUND ART

Among many fields where superconductive wires are practically used is a high resolution nuclear magnetic resonance (NMR) spectroscopy using a superconductive magnet. As resolution of the spectroscopy increases by a higher magnetic field, superconductive magnets excellent in a high magnetic field characteristic are being preferably used more and more.

For the superconductive wire used in the superconductive magnet for generating a high magnetic field, $Nb_3Sn$ wire is put into practical use. The manufacture of $Nb_3Sn$ superconductive wires is usually done by employing a bronze method. According to the bronze method, plural Nb based wires are buried in a Cu—Sn based alloy (bronze) matrix and a drawing process is performed thereon to make the Nb based wire filaments. This multifilamentary superconductive wire group is then buried in copper for stabilization (stabilized copper) and undergoes a drawing process. Later, the drawn wire group is subjected to a heat treatment (diffusion heat treatment) at a temperature between 600° C. and 800° C. and as a result, an $Nb_3Sn$ compound is produced on the interface between the Nb based filament and the matrix (for example, refer to Non-Patent Literature 1). However, there is a limit to the concentration of Sn that can be dissolved in bronze (about 15.8 mass % or below), which leads to a thin $Nb_3Sn$ layer and deterioration in both crystallinity and high magnetic field characteristic.

A powder technique is another known method besides the bronze method to manufacture $Nb_3Sn$ superconductive wires. A typical example of the powder technique is ECN method, in which an intermediate compound powder of Nb and Sn is filled as a core material into an Nb sheath (tube-shaped body) and is subjected to a heat treatment to produce an $Nb_3Sn$ layer on the interface between the core material and the Nb sheath.

Unlike the bronze method, the ECN method does not set any limit to the concentration of Sn that can be dissolved, and is capable of producing a considerably thick $Nb_3Sn$ layer, thereby improving the characteristic of superconductivity. In addition, the ECN method is known to provide a very high critical current density per unit wire cross-sectional area since a non-superconductive area portion can be reduced as much as possible while a superconductive area portion is increased (refer to Non-Patent Literature 2).

Still according to another example of the powder technique (fusion-diffusion powder technique), Ta and Sn are subjected to a melt-diffusion reaction and a product thereof is pulverized to obtain a Ta—Sn alloy powder. The powder is filled into a sheath material made of Nb or an Nb based alloy as a core material (hereinafter referred to as 'powder core part'), and diameter-reduction process and heat treatment are performed thereon (refer to Patent Literature 1). This method also does not have any limit to the quantity of Sn to be used, and the interactive diffusion between Ta and Nb forms an $Nb_3Sn$ layer thicker than the $Nb_3Sn$ layers by the conventional bronze method and ECN method. Consequently, a superconductive wire excellent in a high magnetic field characteristic is obtained.

FIG. 1 is a cross sectional view diagrammatically showing a manufacture of an $Nb_3Sn$ superconductive wire using a powder technique. In FIG. 1, reference numeral 1 denotes a sheath (tube-shaped body) made of Nb or an Nb based alloy, and reference numeral 2 denotes a powder core part filled with raw powder. To carry out the powder technique, the raw powder containing Sn is filled into the powder core part 2 of the sheath 1, and a diameter-reduction process, e.g., a drawing process, is performed when it is pushed out. The wire thus formed is then wound around a magnet and heat-treated to form an $Nb_3Sn$ superconductive layer on the interface between the sheath and the raw powder.

Examples of the raw powder in this case include Ta powder, a mixture of Nb powder and Sn powder, and an intermetallic compound powder obtained from reaction by heat treating Nb powder and Sn powder. In case of the intermetallic compound powder, a ball mill or a jet mill is utilized to pulverize the material after the reaction.

For Ta powder used in the ECN method or the melt-diffusion method, hydrogen may be added to make the Ta powder harden and this hardened Ta powder is mechanically pulverized (hereinafter referred to as "Ta powder with added H") or dissolved by electron beams (hereinafter referred to as "EB powder"). Meanwhile, Sn powder is generally obtained by water or air atomization process.

Although the heat treatment temperature for the formation of superconductive layer is 930° C. or above, it can be lowered down to 750° C. by adding Cu to the raw powder. From this light, ECN or melt-diffusion method adds a very small amount of Cu powder to the raw powder before carrying out heat treatment for producing an intermetallic compound, or disposes a thin Cu layer on the inner side of the sheath. In addition, even though FIG. 1 illustrated a single filament wire, in practice, a lot of multifilamentary wires are placed in a Cu matrix.

The conventional powder techniques mentioned so far pose the following problems in raw powder. First, when Ta powder with added H or EB powder is used, a sintered body is hardened substantially after heat treatment for producing an intermetallic compound (hereinafter referred to as "MD heat treatment"). Thus, pulverization process becomes a very hard task and the operation time overall is much extended. Especially when the Sn concentration is greater than 50 atom %, the pulverization of Ta—Sn powder becomes very difficult. Although pulverization may be possible, the diameter of compound powder is so great that the sheath may be damaged during the drawing process. This also affects the superconductivity property to a considerable extent. In the worst case, the sheath may be broken and the manufacture of superconductive wires itself becomes difficult.

The particle shape of Ta powder with added H is shown in FIG. 2 (electron microscope picture), and the particle shape of Ta powder dissolved by EB is shown in FIG. 3 (electron microscope picture), respectively.

In addition, when the powder contains too much oxygen gas or hydrogen gas, workability or reactivity is deteriorated, hydrogen may be released during MD heat treatment which is dangerous, and degree of vacuum is not increased so one has to wait until the gas is completely escaped from the powder.

The surface of Sn powder is easily oxidized. If an oxide exists on the surface, reactivity is substantially deteriorated during MD heat treatment. Further, the resulting powder structure after the heat treatment is non-uniform, only degrading the wire characteristic.

Although it is typical to mix Cu powder with the raw powder for use in the manufacture of a superconductive wire, if the Cu powder is added prior to the MD heat treatment, relatively large Cu—Sn compounds are produced. Such compounds are very hard and brittle, so it becomes difficult to make wires of a uniform structure.

Moreover, according to the examination by the present inventors, if a Cu—Sn compound is present during the heat treatment for producing an $Nb_3Sn$ superconductive layer, a void is created after the reaction and the uniformity of the wire is not achieved. In addition, they observed another problem that if a Cu—Sn compound exists, Sn or a Sn alloy is easily effused from the end portions during the heat treatment for producing an $Nb_3Sn$ superconductive layer.

In order to fill (or pack) the raw powder into a sheath, a one-axis press is usually employed. However, a pressure pf 10 MPa at the most is applied in such filling method and the actual filling rate of the powder is only about 50%. When the wire process proceeded in that status nevertheless, a uniform structure in the longitudinal direction cannot be obtained and thus, part of the sheath may be damaged.

[Non-Patent Literature 1] K. Tachikawa Filamentary A15 Superconductors, Plenum Press (1980) p1

[Non-Patent Literature 2] W. L. Neijmeijer et al., J. Less-common Metal, Vol. 160 (1990) p161

[Patent Literature 1] Japanese Patent Laid-Open No. H11-250749

DISCLOSURE OF THE INVENTION

Therefore, the present invention has been made in view of the above problems, and it is an object of the present invention to provide a powder technique-based manufacturing method of an $Nb_3Sn$ superconductive wire excellent in a superconductive property, wherein the method does not cause any problem during the manufacture but performs a uniform process.

In accordance with an aspect of the present invention, the above and other objects can be accomplished by the provision of a manufacturing method of an $Nb_3Sn$ superconductive wire using a powder technique, the method comprising the steps of: filling, as raw powder, an intermetallic compound powder obtained from a metallic powder containing at least one metal powder selected from Ta powder and Nb powder, and Sn powder, or a mixture of the metallic powder and the Sn powder into a sheath made of Nb or an Nb based alloy; performing a diameter-reduction process on the sheath to form a wire; heat treating the wire; and, forming a superconductive layer on the interface between the sheath and the packed powder, wherein at least one of the metallic powders selected from the Ta powder and the Nb powder is obtained by aggregating fine particles (primary) in shape of coral to form secondary particles.

In accordance with the present invention, the $Nb_3Sn$ superconductive wire excellent in a superconductive property can be manufactured by taking advantage of properties of Ta powder or Nb powder without causing any inconvenience during the manufacture and performing a uniform process.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
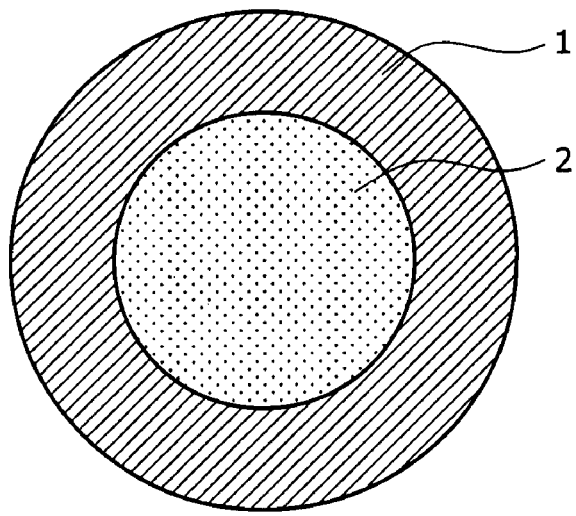
FIG. 1 is a cross sectional view diagrammatically showing an $Nb_3Sn$ superconductive wire obtained from a powder technique.

According to the inventors, by using intermetallic compound powder obtained from Ta powder or Nb powder of which fine particles (primary) are aggregated in a coral shape or using a mixture of the powders as one of the raw powder, surface area of the Ta powder or the Nb powder increases and yield of the intermetallic compound is improved. Here, 'coral shape' means fine powders are aggregated to porous chunks or lumps.

Besides the manufacture of a high performance $Nb_3Sn$ superconductive wire, the present invention brings about the following effects. That is, a compound powder produced is small, the fine melt/diffused powder is obtained, and the pulverization process is substantially facilitated. Moreover, when a diameter-reduction process is performed on wires using the melt/diffused powder thus obtained, a sheath material is not damaged.

In order to form Ta powder or Nb powder aggregated in a coral shape, oxygen in $K_2TaF_7$ or $K_2NbF_7$ is preferably reduced using Na, Mg, Ca and the like.

The raw powder used in the present invention contains Ta powder or Nb powder, of which fine particles (primary) are aggregated in a coral shape. Preferably, the concentration of hydrogen in the powder is 100 ppm or below. By reducing the concentration of hydrogen, it becomes possible to suppress the effusion of hydrogen during the heat treatment. This in turn improves the safety of manufacture and, at the same time, suppresses an increase in pressure during the heat treatment.

It is also desirable to suppress the concentration of oxygen in Ta powder or Nb powder below 3000 ppm. By reducing the oxygen concentration, it becomes possible to improve reactivity during the production of $Nb_3Sn$. In addition, the size of secondary particles of Ta powder or Nb powder is preferably the same as that of Sn powder to be mixed with. By constituting the particle sizes in this manner, raw powder can be mixed more uniformly, leading to the improvement of performance. Moreover, from an aspect of powder fluidity, an average particle size of the secondary particles is preferably in a range of 10 to 100 μm. The average particle size of the secondary particles is measured using a particle size analyzer (LMS-24, light source: semiconductor laser (wavelength: 670 nm), manufactured by Seishin Enterprise Co., Ltd.) based on laser diffraction. For the measurement, ethanol, for example, is used as a dispersion medium. The measurement can also be done using an electron microscope, i.e., measuring an average particle size of the secondary particles on a picture taken by the electron microscope.

The most appropriate way to obtain primary particles of Ta powder or Nb powder is an oxygen reduction process using Na, in which oxygen in $K_2TaF_7$ or $K_2NbF7$ is reduced using Na and the concentration of H is lowered by heat treatment.

The oxygen reduction process using Na makes it possible to obtain fine particles (primary) of an average particle size between 0.1 µm and 20 µm and form secondary particles by aggregating the primary particles in a coral shape. Further, the above process is effective in reducing the concentration of hydrogen or oxygen to the level as indicated above. Commercially available powders include Cabot's oxygen-reduced powder using Na and Starck's oxygen-reduced powder using Na.

The raw powder used in the present invention is mixed with Sn powder. Desirably, the Sn powder has an oxygen concentration of 2000 ppm or below. By utilizing Sn powder with reduced oxygen concentration, it becomes possible to improve workability and reactivity during the production of $Nb_3Sn$. The Sn powder may be prepared by an atomization process under inert gas atmosphere (usually nitrogen).

Although there is no particular limit to the mixture ratio of Ta powder/Nb powder to Sn powder, a preferable mixture ratio from the light of superconductive properties, is Ta or Nb:Sn=2:1 to 1:2 (atom ratio).

Likewise, there is no particular limit to the preparation procedure of the raw powder. However, according to a desired preparation method, Ta powder or Nb powder is mixed with Sn powder, and a heat treatment and a pulverization process are performed on the mixture to produce Ta—Sn compound powder or Nb—Sn compound powder. Lastly, Cu powder is added. When the raw powder is prepared in this sequence, Cu powder and Sn powder cannot react with each other during MD heat treatment, and it becomes possible to prevent the decrease in temperature for heat treatment for producing $Nb_3Sn$, the effusion of Sn during the heat treatment and the occurrence of a void at powder core parts after the same heat treatment.

In the present invention, upon packing the raw powder into a sheath material, the CIP (Cold Isostatic Pressing) method is employed, namely, a process for isostatically pressing raw powder into the sheath material. In this manner, the filling rate of the raw powder into the sheath can be increased up to 70% or higher and a uniform process is facilitated. To carry out such pressing treatment, it is desirable to set the mixture ratio of nonreactive Sn powder which does not form the intermetallic compound powder to 5 mass % or more. The nonreactive Sn can be a nonreactive Sn component among the intermetallic compound powder, or its mixture ratio can be adjusted by adding Sn powder separately from the metallic compound, or both. Such nonreactive Sn powder improves smoothness between particles during an extrusion drawing process and further improves workability.

The embodiments of the present invention will be specifically illustrated below referring to drawings. While the invention has been described in conjunction with various embodiments, they are illustrative only. Accordingly, many alternative, modifications and variations fall with the spirit and broad scope of the invention.

EXAMPLES

Experimental Example 1

Ta powder, of which primary particles are obtained by the oxygen reduction process using Na while secondary particles are formed by aggregating the primary particles in a coral shape, was prepared. An average particle size of primary particles was 10 µm or below and an average particle size of secondary particles was between 30 µm and 200 µm. According to the measurement by inert gas fusion method (measurement device: LECO's RH-404 (hydrogen), TC-436R (oxygen), Applied voltage: 5000 W, Analysis time: 85 sec), the concentration of hydrogen in the powder of interest was 56 ppm and that of oxygen was 600 ppm. The average particle size of primary particles was obtained using an electron microscope picture (× 5000). For the measurement, 30 particles out of ones with measurable diameters were randomly selected, and diameters of these randomly selected particles were measured and averaged. Similarly, the average particle size of secondary particles was obtained using an electron microscope picture (× 1000), and diameters of randomly selected particles were measured and averaged.

Figure 4:
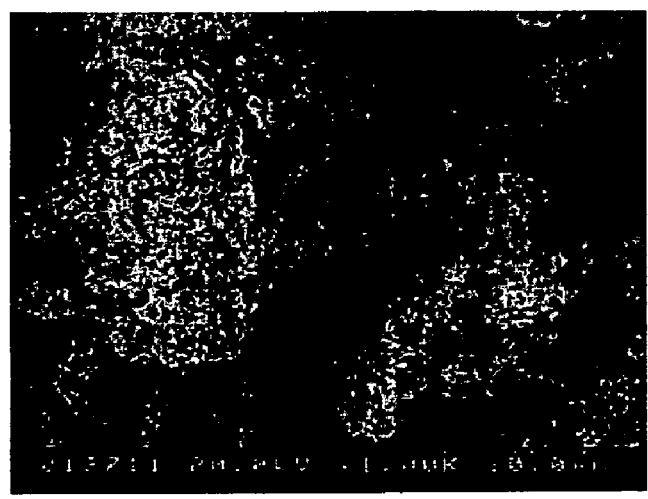
FIG. 4 is an electron microscope picture showing a particle shape of Ta powder produced by an oxygen reduction process by using Na.
Figure 5:
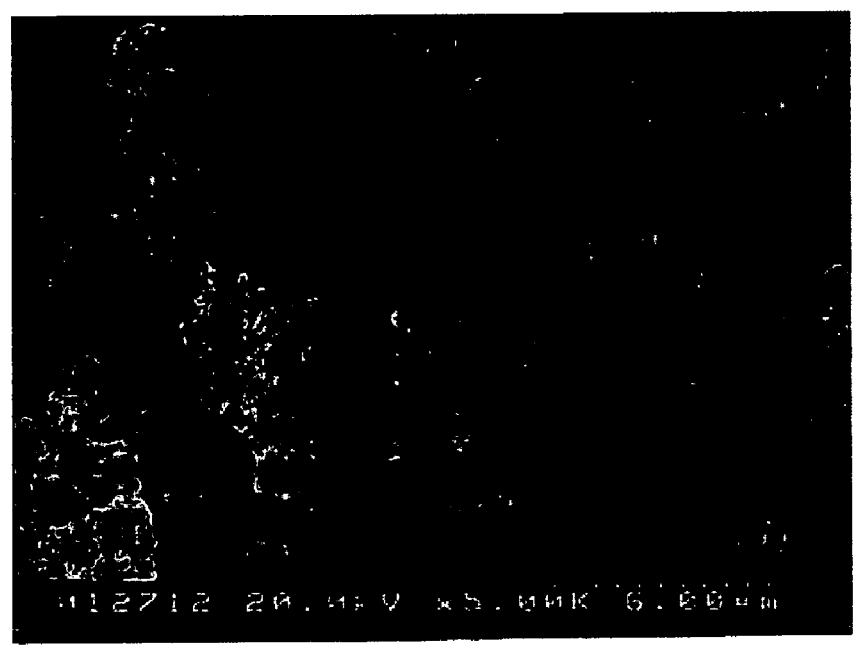
FIG. 5 is an electron microscope picture showing an enlarged view of a particle shape of Ta powder produced by an oxygen reduction process by using Na.

The particle structure of the Ta powder is shown in FIG. 4 (EM picture), and its magnified view observed at a high magnification is shown in FIG. 5 (EM picture).

In the meantime, Sn powder (80% has a particle size of 20 µm or below) atomized with nitrogen gas was prepared. The same method was used to measure oxygen concentration in Sn powder. It turned out that Sn powder contained 600 ppm of oxygen.

Each powder was weighed to make Ta: Sn=6:5 (atom ratio), and was mixed in V blender for about 30 minutes.

The mixed powder (raw powder) was then heat treated (fusion-diffusion treatment) at 950° C. for 10 hours (5 hours for increasing temperature) under vacuum of $10^{-3}$ Pa or below to obtain Ta—Sn compound powder. This compound powder was roughly pulverized and then pulverized for 5 more minutes in automatic mortar. As a result, almost 100% of the produced powder passed through a 150 µm mesh. Semiquantitative analysis by X ray diffraction on the obtained powder proved that approximately 8±1 mass % of nonreactive Sn resides in the powder.

With respect to 100 mass % of the produced powder, 10 mass % of Sn powder and 5 mass % of Cu powder was added, and the mixture was filled into a rubber tube having a 40 mm diameter×210 mm of inner capacity and was compressed under CIP at 200 MPa for 5 minutes.

A casting thus obtained was then inserted into a sheath (outer diameter: 50 mm and inner diameter: 30 mm) made of an Nb– 7.5 mass % Ta alloy, and the sheath was inserted into an extrusion billet (outer diameter: 65 mm and inner diameter: 55 mm) made of oxygen free copper. This extrusion billet was extruded by a hydrostatic pressure extruder and was then processed to a wire diameter of 1 mm by dies drawing.

In order to produce $Nb_3Sn$, the wire was heat treated at 700° C. for 10 hours under vacuum. Following the heat treatment, the wire was subjected to a critical current density Jc measurement between superconductive magnets. It turned out, at a temperature of 4.2K and in a magnetic field of 20 T, the critical current density was 520±36A/mm².

Experimental Example 2

Figure 2:
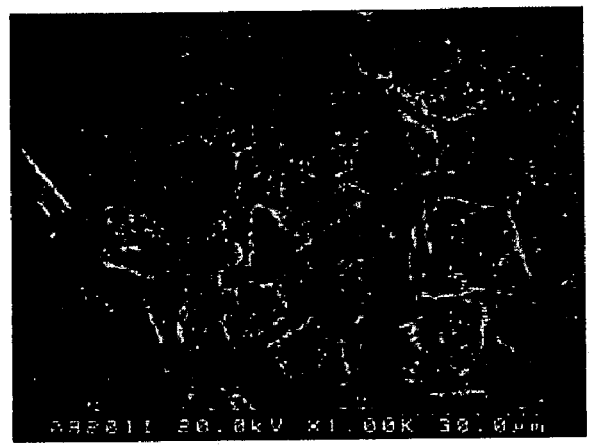
FIG. 2 is an electron microscope picture showing a particle shape of Ta powder with added H.
Figure 3:
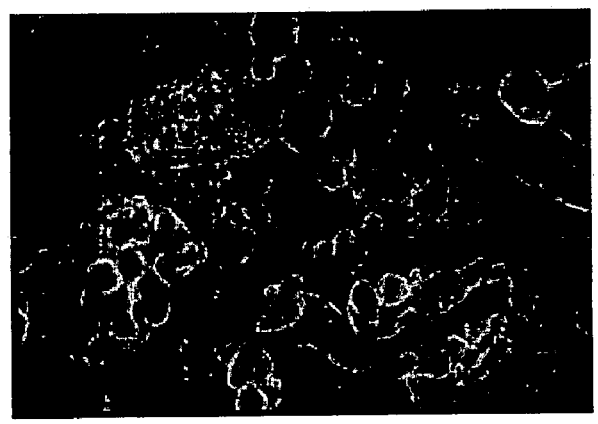
FIG. 3 is an electron microscope picture showing a particle shape of Ta powder dissolved by EB.

The same method used in Experimental Example 1 was used to prepare an intermetallic compound powder, except for that EB powder of an average particle size of 325 mesh or below (45 µm or below) shown in FIG. 2 was used as Ta powder. It turned out that the same pulverization technique employed in Experimental Example 1 after melt-diffusion heat treatment was not so effective to obtain fine powder. Moreover, although a pulverization process was performed in automatic mortar for one hour, the amount of powder having passed through a 150 µm-mesh was merely about 60%.

Experimental Example 3

The Ta powder with reduced oxygen using Na obtained from Experimental Example 1 was used, except for that hydrogen concentration in the Ta powder was 1500 ppm and oxygen concentration was 4000 ppm. Although the melt-diffusion treatment was proceeded using this Ta powder, the internal pressure of a furnace was increased around a temperature of about 500° C. due to the effusion of hydrogen. For the safety of a heat treatment furnace, the heating process was virtually stopped. Later, when the temperature was lowered, a degassing phenomenon was controlled. After the pressure was restored, heat treatment was restarted, but again the temperature started increasing around 500° C. due to the degassing phenomenon. Afterwards, the same procedure was repeated for 10 hours. In short, for increasing the temperature for heat treatment up to 950° C., it took 15 hours, which is three times the predetermined amount of time (5 hours).

In addition, by using the powder thus obtained, a superconductive wire was prepared following the same procedure as in Experimental Example 1 and critical current density thereof was measured. At a temperature of 4.2K and magnetic field of 19 T, the critical current density was about 50 A/mm$^2$ at most. It was assumed that oxygen in the Ta powder must have inhibited the production of $Nb_3Sn$.

Experimental Example 4

To prepare Sn powder, water atomization method was used (particles of such powder could pass through a 75 μm mesh screen). Oxygen concentration in the powder was 4000 ppm. As is done in Experimental Example 1, the Sn powder was mixed with Ta powder, and the same heat treatment (fusion-diffusion treatment) was performed thereon. The produced compound powder was pulverized and was analyzed by X-ray diffraction. It turned out the amount of residual Sn in the powder was 11±9 mass %, being considerably nonuniform.

The intermetallic compound powder thus obtained was processed into a wire as done in Experimental Example 1, and a heat treatment was performed thereon to prepare a superconductive wire. When critical current density of the superconductive wire was measured, it was 450±150 A/mm$^2$ at a temperature of 4.2K and magnetic field of 20 T. Compared with Experimental Example 1, the average value was low and nonuniformity was very severe.

Experimental Example 5

As done in Experimental Example 1, melt/diffused and pulverized powder was mixed with the same amount of Sn powder and Cu powder. Instead of performing isostatic pressing (e.g., CIP) the mixed powder was filled into a sheath by a one axis press and was drawn under the same conditions. It turned out that the sheath started to get cracked at the wire diameter of 1.52 mm.

Although all of the above-described examples used the intermetallic compound powder as the raw powder, the method of the present invention is not limited thereto. For example, a mixture of Sn powder and at least one metallic powder selected from Ta powder and Nb powder can be used as the raw powder and filled into the sheath. It turned out that even if such raw powder may be used, there was no problem with reactivity of Nb and Sn in the sheath during the production of $Nb_3Sn$ by heat treatment.

And, as explained before, the average size of primary particles of the Ta powder or the Nb powder used in the present invention is preferably 20 μm or below, and the Ta powder or the Nb powder can be obtained from the oxygen reduction process using Na. Moreover, hydrogen concentration in the Ta powder or Nb powder is 100 ppm or below, or oxygen concentration therein is preferably 3000 ppm or below.

Meanwhile, oxygen concentration in the Sn powder is preferably 2000 ppm or below. Such Sn powder is prepared by inert gas atomization.

To carry out the present invention method, the row powder is preferably treated with cold isostatic pressing before it is filled into the sheath material. Here, the raw powder prior to the isostatic pressing treatment desirably contains 5 mass % or more of Sn powder.

If necessary, the raw powder used in the present invention may further contain Cu as its ingredient. In such case, the Ta—Sn compound powder or the Nb—Sn compound powder is first prepared by mixing Sn powder with at least one metallic powder selected from Ta powder and Nb powder, and carrying out the heat treatment and the pulverization process thereon. Later, Cu powder is added to the prepared compound powder and they are filled into the sheath material.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A manufacturing method of an $Nb_3Sn$ superconductive wire using a powder technique, the method comprising the steps of:
   reducing oxygen in primary particles of at least one of metallic powders selected from Ta powder and Nb powder using Na, Mg, or Ca;
   aggregating the primary particles thereby obtaining secondary particles in a shape of coral;
   filling, as a raw powder, an intermetallic compound powder obtained from said secondary particles and Sn powder, or a mixture of the secondary particles and the Sn powder, into a sheath made of Nb or an Nb based alloy;
   performing a diameter-reduction process on the sheath to form a wire;
   heat treating the wire; and
   forming a superconductive layer on the interface between the sheath and the filled powder.

2. The method according to claim 1, wherein an average particle size of primary particles of the at least one metallic powder selected from the Ta powder and the Nb powder is 20 μm or below.

3. The method according to claim 1, wherein hydrogen concentration in the at least one metallic powder selected from the Ta powder and the Nb powder is 100 ppm or below, and oxygen concentration therein is 3000 ppm or below.

4. The method according to claim 1, wherein oxygen concentration in the Sn powder is 2000 ppm or below.

5. The method according to claim 4, wherein the Sn powder is obtained from an inert gas atomization method.

6. The method according to claim 1, wherein the raw powder is isostatically pressed before being filled into the sheath.

7. The method according to claim 6, wherein the raw powder before being isostatically pressed contains 5 mass % or more nonreactive Sn.

8. The method according to claim 1, wherein the raw powder further contains Cu powder.

9. The method according to claim 8, wherein the Sn powder is mixed with at least one metallic powder selected from the Ta powder and the Nb powder to prepare a Ta—Sn compound powder or an Nb—Sn compound powder, and Cu powder is added to the compound powder and filled into the sheath.

* * * * *